United States Patent [19]

Gheewala et al.

[11] Patent Number: 5,202,624
[45] Date of Patent: Apr. 13, 1993

[54] INTERFACE BETWEEN IC OPERATIONAL CIRCUITRY FOR COUPLING TEST SIGNAL FROM INTERNAL TEST MATRIX

[75] Inventors: Tushar R. Gheewala, Cupertino; Hector R. Sucar, Fremont, both of Calif.

[73] Assignee: Cross-Check Technology, Inc., San Jose, Calif.

[21] Appl. No.: 744,205

[22] Filed: Aug. 12, 1991

[30] Foreign Application Priority Data

Aug. 31, 1990 [GB] United Kingdom ............... 9019021

[51] Int. Cl.$^5$ .......................................... G01R 31/02
[52] U.S. Cl. .............................. 324/158 R; 324/73.1; 371/15.1; 371/22.3
[58] Field of Search ................. 324/73.1, 158 R; 371/22.1, 22.6, 22.2, 22.3, 15.1, 16.1; 307/231, 303, 303.1

[56] References Cited

U.S. PATENT DOCUMENTS

| | | | |
|---|---|---|---|
| 3,761,675 | 9/1973 | Mason et al. | 364/474.08 |
| 3,806,891 | 4/1974 | Eichelberger et al. | 340/172.5 |
| 4,293,919 | 10/1981 | Dasgupta et al. | 364/716 |
| 4,485,472 | 11/1984 | Sproull et al. | 371/15.1 |
| 4,513,418 | 4/1985 | Bardell, Jr. et al. | 371/25 |
| 4,749,947 | 6/1988 | Gheewala | 371/22.6 |
| 4,912,709 | 3/1990 | Teske et al. | 371/22.1 |
| 4,937,826 | 6/1990 | Gheewala et al. | 371/22.1 |
| 4,975,640 | 12/1990 | Lipp | 324/73.1 |
| 5,065,090 | 11/1991 | Gheewala et al. | 324/158 R |

OTHER PUBLICATIONS

E. B. Eichelberger et al., "A Logic Design Structure For LSI Testability" *Proceedings 14th Design Automation Conference,* Jun. 1977 77CH1216-1C, pp. 462-468.
E. J. McCluskey, "Built-in Self-Test Techniques," and Built-in Self-Test Structures, *IEEE Design and Test,* vol. 2, No. 2, pp. 437-452.

*Primary Examiner*—Vinh Nguyen
*Attorney, Agent, or Firm*—Townsend and Townsend

[57] ABSTRACT

A programmable interface apparatus between a first circuit and either a second operational circuit, or a primary pin, of an IC includes a latch for receiving a test signal. The latch is controlled using probe lines and sense lines from an internal test matrix. In one configuration, such an interface is programmably configured to couple either a primary input signal or a test signal to the operational circuitry. In another configuration, such an interface is programmably configured to couple either an operational circuit signal or a test signal to a primary output pin. In still another configuration, such an interface is programmably configured to couple either an operational circuit signal or a test signal to an operational circuit element. In one embodiment, the interface is formed with a pair of transmission gates, the latch and an invertor. An advantage of such structure is the minimal IC area required. A global control signal is coupled to each transmission gate for configuring the interface for normal operation or test signal operation. For normal operation, an input signal is coupled directly to the interface output. For test signal operation, a test signal is applied to the interface output.

8 Claims, 3 Drawing Sheets

INTERFACE BETWEEN IC OPERATIONAL CIRCUITRY FOR COUPLING TEST SIGNAL FROM INTERNAL TEST MATRIX

CROSS REFERENCE TO RELATED APPLICATION

This invention is related to commonly-assigned U.S. Pat. No. 4,749,947 issued Jun. 7, 1988 for GRID-BASED, "CROSS-CHECK" TEST STRUCTURE FOR TESTING INTEGRATED CIRCUITS; commonly-assigned U.S. Pat. application Ser. No. 601,969, filed Oct. 23, 1990 for METHOD AND APPARATUS FOR SETTING DESIRED LOGIC STATE AT INTERNAL POINT OF A SELECT STORAGE ELEMENT; and commonly-assigned U.S. Pat. application No. 482,458 filed Feb. 20, 1990 for METHOD FOR OPERATING A LINEAR FEEDBACK SHIFT REGISTER AS A SHIFT REGISTER WITH A CROSSCHECK GRID STRUCTURE. The contents of such patent and patent applications are incorporated herein by reference in their entirety, and made a part hereof.

BACKGROUND OF THE INVENTION

This invention relates to internal test structures for testing an integrated circuit, and more particularly to an interface between operational circuitry and primary pins or other operational circuitry of an IC, the interface receiving a test signal from an internal test matrix.

Complex integrated circuits (i.e., VLSI) conventionally include internal test structures. Such test structures access test points which are coupled to operational circuitry. To test a complex integrated circuit (i.e., VLSI) test signals typically are applied to select test points, while responses are sensed from other select test points. According to a conventional "SCAN" approach, one or more primary pins are used for entering test signals to shift registers, which then are relayed to select internal storage elements through test points. See "Design For Testability - A Survey" by T.W. Williams and K.P. Parker, Proceedings IEEE. Vol. 71, pp. 98-112, January 1983; and "A Logic Design Structure For LSI Testing" by E.B. Eichelberger and T.W. Williams, Proceedings 14th Design Automation Conference, June 1977 77CH1216-1C, pp. 462-468. Also see "Built-in Self-Test Techniques" and "Built-in Self-Test Structures" by E.J. McCluskey, IEEE Design and Test, Vol. 2, No. 2, pp. 437-452. Also see U.S. Pat. Nos. 3,806,891 (Eichelberger et. al.); 3,761,675; 4,293,919 (Dasgupta et. al.) and 4,513,418 (Bardell, Jr. et. al.) assigned to the IBM Corporation which disclose the serial connection of flip-flops into a shift register to allow access to them through "fewer" test points.

Such scan structures are complex requiring significant chip area. Also, long serial input sequences are required to implement a test. As a result, test operations require long time periods. Accordingly, there is a need for an alternative interface structure between the primary pins of an IC and the operational circuitry which provides minimal area overhead and allows efficient communication speeds.

According to another test approach a grid-based test structure is integrated into the IC with the operational circuitry. Such a structure is described in commonly-assigned U.S. Pat. No. 4,749,947 issued Jun. 7, 1988 for GRID-BASED, "CROSS-CHECK" TEST STRUCTURE FOR TESTING INTEGRATED CIRCUITS. Such test structure enables access to internal operational circuit elements which are not directly accessible through the IC's primary pins. To further ease the test process, a programmable interface structure is needed which enables the test structure to access circuits at the operational circuitry boundary (e.g., circuit elements directly coupled to the primary pins). Further, a programmable interface for routing test responses off-chip through primary output pins is needed.

SUMMARY OF THE INVENTION

According to the invention, a programmable interface apparatus between operational circuitry of an IC includes a latch which couples a test signal from an internal test matrix to the operational circuitry. The interface is controlled using a single internal, global control line to couple either an operational signal or a test signal to the operational circuitry. The interface may couple one operational circuit element to another or may couple a primary pin to an operational circuit element.

In one configuration (e.g., primary input pin to operational circuit), the interface couples a primary input signal or test signal to operational circuitry. In another configuration (e.g., operational circuit to primary output pin), the interface couples an operational output signal or test signal to a primary output pin. In yet another configuration (e.g., operational circuit to operational circuit), the interface couples one operational circuit output signal or a test signal to an operational circuit.

In one embodiment, the interface is formed with a pair of transmission gates, a latch and an invertor. A global control signal is coupled to each transmission gate for configuring the interface for normal operation or test signal operation. For normal operation, an input signal is coupled directly to the interface output. For test signal operation, a test signal received from an internal test structure is applied to the interface output (and thus, to a primary pin or operational circuitry).

According to one aspect of the invention, a latch controlled by signals from the internal test matrix is used to couple a test signal from internal test structure to operational circuitry or a primary pin through the interface. The test matrix signals include probe lines and sense lines. A probe line enables the latch, while a sense line writes a logic state (e.g., test signal) into the latch. Such probe lines and sense lines also are used for setting logic states at internal circuit elements. An advantage of using the probe lines and sense lines to control the latch is that race conditions between the test signal and an operational signal are avoided during testing. An advantage of using a simple latch is that minimal chip area is required. Another advantage of the latch is that test signals are loaded serially without the need for complex scan registers.

According to another aspect of the invention, the interface couples a primary input pin to operational circuitry. Such interface is programmable enabling a test signal to be applied to the operational circuitry in place of a signal received at the primary input pin. Such test signal is received from an internal test matrix.

According to another aspect of the invention, the interface couples operational circuitry to a primary output pin. Such interface is programmable enabling a test signal to be applied to the primary output pin in place of the signal from the operational circuitry. Such test signal is received from internal test circuitry and for example, may be a test signal response routed from some internal circuit element through the internal test structure and interface.

According to another aspect of the invention, the operation of the interface itself may be tested by sensing a signal value at select nodes within the interface structure.

Advantages of the interface include the ability to apply signals in parallel on primary input pins and/or primary output pins; the minimal area overhead; the use of a single global control line which is an internal signal line; elimination of race conditions in the application of test signal and operational signals; minimal performance overhead; serial loading of signals without complex scan structures; and direct control of the primary output pins for driving off-chip devices in a system.

The invention will be better understood by reference to the following detailed description taken in conjunction with the accompanying drawings.

DESCRIPTION OF SPECIFIC EMBODIMENTS

Overview

Figure 1:
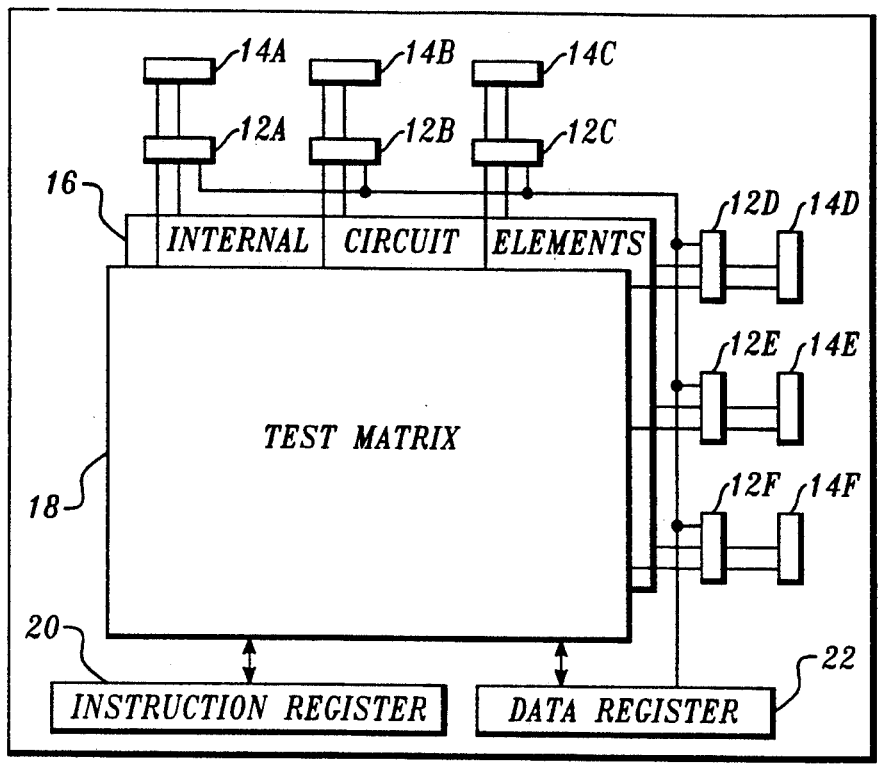
FIG. 1 is a block diagram of an IC including the interface apparatus according to an embodiment of this invention.

FIG. 1 shows an integrated circuit including primary-pin interfaces 12 according to an embodiment of the invention. A respective interface 12 couples a respective primary pin 14 to the operational circuitry 16 and test matrix 18. Operational circuitry 16 is made up of a plurality of operational circuit elements. A primary pin 14 is an IC I/O contact used for coupling the IC to other ICs on a circuit board. Primary pins 14 may therefore also be referred to primary I/O pins; primary input pins or primary outputs as appropriate throughout. A primary pin is distinguished from a test point contact which is accessible, but is not used for normal interconnection of the IC to other ICs. The integrated circuit 10 also includes an instruction register 20 and data register 22 used for controlling test circuitry within the test matrix 18. The instruction register 20, data register 22, test matrix 18 and interface 12 form the internal test structure of the IC.

During normal operation, input signals are received at primary input pins (i.e., 14a-14c) and routed via the corresponding interfaces (12a-12c) to internal circuit elements within the operational circuitry 16. Analogously, output signals derived by internal circuit elements of operational circuitry 16 are routed through interfaces (i.e., 12d-12f) to corresponding primary pins (14d-14f).

The test matrix 18 includes test circuitry for testing the operational circuitry 16. Test signals are applied to operational circuit elements through the test matrix. Such test signals may be generated either on-chip or off-chip. Off-chip signals are received into the data register 22, then routed to the test matrix 18. Similarly, on-chip signals are loaded into the data register 22, then routed to the test matrix 18. Response signals are detected by the test matrix 18, loaded into the data register 22 and output off-chip via one or more interfaces 12 and primary output pins 14.

Although the interfaces 12 are shown as coupling a primary pin to an operational circuit element, interfaces 12 also may be used to couple one operational circuit to another. The output signal from one operational circuit normally is coupled to the other operational circuit, but instead is channeled through the interface 12. The interface 12 is controlled to determine whether the operational output signal is passed or whether a test signal from the test matrix 18 is passed.

Test Matrix

Figure 2:
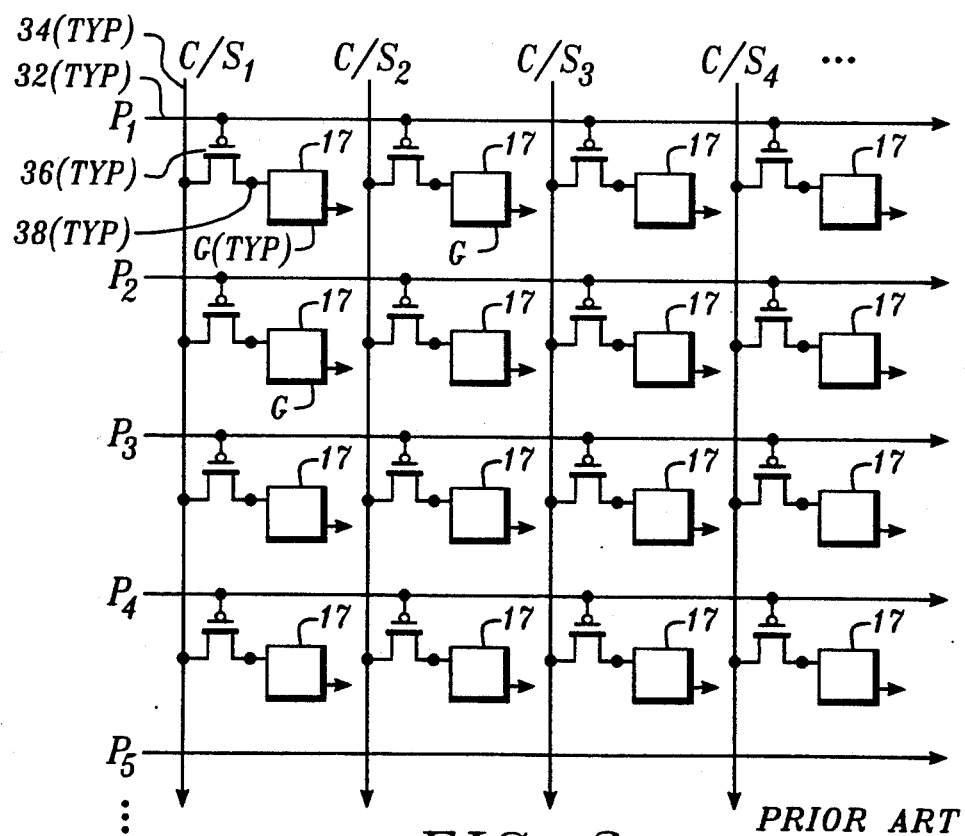
FIG. 2 is a block diagram of the test matrix of FIG. 1 as coupled to operational circuit elements G.

FIG. 2 shows a conventional test matrix 18 as described in commonly-assigned U.S. Pat. No. 4,749,947 issued Jun. 7, 1988 for GRID-BASED, "CROSS-CHECK" TEST STRUCTURE FOR TESTING INTEGRATED CIRCUITS. The test matrix 18 is formed of individually accessible probe lines 32 and control/sense lines 34 with electronic switches 36 at the crossings. A probe line 32 is coupled to a switch 36 for defining the switch "ON" or "OFF" state. One conducting channel of the switch 36 is coupled to a test point 38, while another conducting channel is coupled to a control/sense line 34. Each test point is coupled to one or more internal operational circuit elements 17 of the operational circuitry 16. FIG. 2 shows operational circuitry gates G coupled to respective test points 38.

Each control/sense line 34 is coupled to the data register 22 (FIG. 1) via a sense receiver / control driver (not shown). When the sense driver is inactive, the line 34 functions as a sense line for monitoring a response signal from the test point 38. When the control driver is active, the line 34 functions as a control line along which a control signal is conducted toward a test point 38. Activating a select switch 36 through a corresponding probe line 32 enables a test point 38 to be sensed or controlled.

Methods for controlling the test point signal level are described in commonly-assigned U.S. Pat. application No. 554,313 filed Jul. 17, 1990 for METHOD AND APPARATUS FOR SETTING DESIRED SIGNAL LEVEL ON STORAGE ELEMENT.

The IC 10 is tested by applying respective control signals to select test points 38 and sensing respective response signals from other select test points 38. To apply a control signal to a select test point 38, the instruction register 20 is loaded. The instruction register 20 in response activates a select probe line and enables an appropriate control driver/sense receiver to function as a driver. The control signal then is read from a corresponding bit of the data register 22, and fed through switch 36 to the select test point 38.

To sense a response signal from a select test point 38, the instruction register 20 activates a select probe line and sets an appropriate control driver/sense receiver to receiver. The response signal then is read from the select test point 38 through switch 36 into data register 22.

The steps of driving a control signal and monitoring a response signal at different test points are accomplished with one or more instructions loaded into instruction register 20. A first instruction may activate a first probe line and first control line, while a second instruction activates a second probe line and second sense line.

A detailed description of the instruction register 20 and data register 22 is described in commonly-assigned U.S. Pat. application No. 482,458 filed Feb. 20, 1990 for METHOD FOR OPERATING A LINEAR FEEDBACK SHIFT REGISTER AS A SHIFT REGISTER WITH A CROSSCHECK GRID STRUCTURE.

Primary-Pin Interface Circuit

Figure 3:
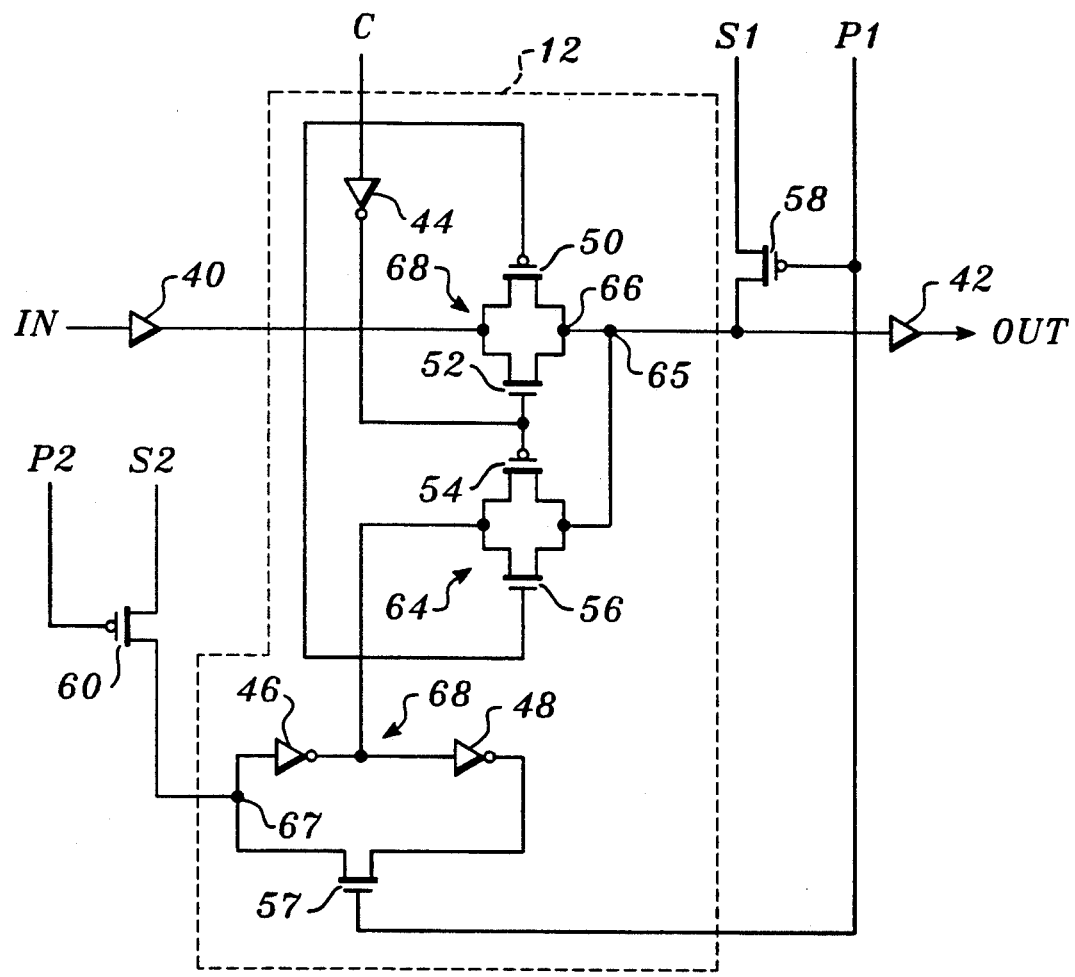
FIG. 3 is a schematic diagram of the interface apparatus of FIG. 1 according to an embodiment of this invention.

FIG. 3 shows an interface circuit 12 for coupling either a primary input pin, a primary output pin or a first operational circuit to a second operational circuit (in circuitry 16) and test matrix 18. One function of the interface 12 is to allow a test signal from the test matrix 18 to be input to the operational circuitry 16 instead of a primary pin signal or a first operational circuit signal. Another function is to enable a test signal response from the test matrix 18 to be output from a primary output pin or first operational circuit in place of a direct signal from the first operational circuit.

For an interface 12a coupled to a primary input pin 14a, an input signal IN is received from primary input pin 14a via driver 40. Under normal operations, the input signal IN is routed through the interface 12 to the operational circuitry 16 via driver 42. Such interface 12a, however, may be programmed to input a test signal from data register 22 to the operational circuitry 16 instead of the input signal IN.

For an interface 12d coupled to a primary output pin 14d, a signal IN is received from an internal circuit element via driver 40. Under normal operations, the signal IN is routed through the interface 12d to the primary output pin 14d via driver 42. Such interface 12d, however, may be programmed to output a test signal response from the data register 22 to the primary output pin 14d instead of passing the signal IN.

For an interface 12 coupled to first and second operational circuits, a signal IN is received from the first operational circuit. Under normal operations, the signal IN is routed through the interface 12 to the second operational circuit. Such interface 12, however, may be programmed to output a test signal response from the data register 22 to the second operational circuit instead of passing the signal IN. For such embodiment, the drivers 40, 42 (FIG. 3) may be omitted.

As shown in FIG. 3, interface 12 receives signals C, S1, S2, P1 and P2 from the test matrix 18. Signal C is a global control line connected to each interface 12 for switching the interface between normal operation in which a signal IN is passed from driver 40 to driver 42 and alternate signal operations in which a substitute signal is applied to driver 42. Signals S1 and S2 are sense/control line signals from the test matrix 18. Signals P1, P2 are probe line signals from the test matrix 18. Test matrix transistors 58, 60 also are shown. When probe line signal P1 is active (e.g., active low), sense line signal S1 is passed through transistor 58. When probe line signal P2 is active (e.g., active low), sense line signal S2 is passed through transistor 60.

The interface 12 includes invertors 44, 46, and 48, along with FET transistors 50, 52, 54, 56 and 57. Transistors 50, 52 are coupled together as one transmission gate 62, while transistors 54, 56 are coupled together as another transmission gate 64. Under normal operations, transmission gate 62 passes the signal IN to the driver 42. More specifically, when control signal C from the test matrix 18 is at a first logic state (e.g., logic zero) transmission gate 62 passes the signal IN from driver 40 to driver 42 for output as signal OUT. When control signal C is at a second logic state (e.g., logic one) transmission gate 62 does not pass the signal IN. Instead the gate 62 defines a high impedance at node 66. Control signal C is coupled directly to the gate of transistor 50 and indirectly via invertor 44 to the gate of transistor 52.

Transmission gate 64 also receives the control signal directly at the gate of one transistor 56, and indirectly via invertor 44 at the other transistor 54. Under normal operations (e.g., C=logic zero), transmission gate 64 is not activated so as not to compete with the output signal IN from the transmission gate 62. However, under alternate signal operations (e.g., C=logic one), transmission gate 64 is active to pass a signal to driver 42. Transmission gate 62 is inactive during such time. Thus, transmission gates 62, 64 are configured so that only one of the two gates is active as determined by the logic state of global control signal C.

Invertors 46, 48 and transistor 57 are configured as a latch circuit 68. The output of the latch 68 is coupled to the transmission gate 64. A data input to the latch is received from the drain of transistor 60. When probe line signal P2 is active (e.g., active low), the value of the sense line signal S2 is input to latch 68 at invertor 46. When probe line signal P1 is active (e.g., active low), the sense line signal S2 is output to the transmission gate 64. When probe line signal P1 is inactive (e.g., high), the latch contents do not change.

Interface Operation

Table A below summarizes the interface 12 functions:

TABLE A

| Instruction | Function |
| --- | --- |
| C = 0 | Normal Operations (driver 40 to 42) |
| C = 1 | Alternate signal op. (latch to driver 42) |
| P1 = 0, P2 = 0 | S2 written to latch 68 |
| P1 = 0, P2 = 1 | Test matrix reads S1 |
| P1 = 1, P2 = 0 | Test matrix reads S2 |

TABLE A

The functions listed in Table A are described below according to the interface operations performed. The interface operations include normal operation, alternate input, alternate output and self-test.

Normal Operation

Normal operation is defined as the time when control signal C is set to a first logic state (e.g., C=0). During such time, driver 40 is coupled to the driver 42 through interface 12. Thus, for a primary input pin connection, the signal IN received from a primary input pin is transmitted through drive 40, interface 12 and driver 42 to the operational circuitry 16 as signal OUT. Typically, signal OUT is routed to one or more circuit elements within the operational circuitry 16. Similarly, for a primary output pin connection, the signal IN received from operational circuitry 16 is transmitted through driver 40, interface 12 and driver 42 to the primary output pin 14 as signal OUT.

Test Signal Input

A test signal is routed to the interface output, driver 42 when the control signal C is at a second logic state (e.g., C=1). For an interface 12 coupled to a primary input pin 14, a test signal (to the signal IN) is passed from the interface 12 to the driver 42 and into the operational circuitry 16. To apply such test signal, the test signal value is loaded into latch 68 from sense line S2 by applying active probe line P1 and P2 signals (e.g., logic zero). With the desired test signal value loaded at the latch, the value then is transmitted through gate 64 to driver 42 and operational circuitry 16 by setting the global control signal C to the second logic value (e.g., C=1).

The test signal (sense line signal S2) logic state is defined by the data register 22. Thus, when the data register 22 is loaded with a test signal value, the value is sent along sense line S2 to the latch 68 for input to an internal circuit element.

Test Signal Output

For an interface 12 coupled to a primary output pin 14, a test signal (to the signal IN) is passed from the interface 12 to the driver 42 and primary output pin 14 when control signal C is at the second logic state. To apply such test signal, the test signal (sense line signal S2) value is loaded into latch 68 by applying active probe line P1 and P2 signals (e.g., logic zero). With the desired test signal value loaded at the latch 68, the value then is transmitted through gate 64 to driver 42 and primary output pin 14 by setting the global control signal C to a logic one.

The sense lines are coupled to data register 22. The test signal value thus is defined by the data register 22. The data register 22 is coupled to the test matrix for sensing responses to test signals. For a given response, the sensed value is stored, then transferred as sense line sinal S2 to latch 68. By applying the instructions P1=0, P2=0 followed by the C=1 instruction, the response is transmitted into and through the interface 12 to driver 42 and primary output pin 14.

Self-Test

To allow the test matrix 18 to test the interface 12, additional functions as listed above in Table A also are performed. By setting the probe line signal P1 active (P1=0) and the probe line signal P2 inactive (P2=1), the value at node 65 is sensed. Such value is received into transistor 58 and read by the data register as sense line signal S1. By performing such function while C=0 (normal operation), the value sensed is the value of signal IN if the interface is performing properly. By performing such function while C=1, the value sensed at node 65 is the value stored in the latch if the interface is performing properly. Thus, a value can be loaded in the latch (P1=0, P2=0), then read out (P1=0, P2=1) as sense line signal S1 to test one path through the interface; or loaded with a value through the primary input pin 14, then read out (P1=0, P2=1) as sense line signal S1 to test the other path through the interface.

Another self-test instruction is P1=1, P2=0. For this instruction the value at node 67 is received into transistor 60 and coupled to the data register 22 as sense line signal S2.

Note that the sense lines carrying signals S1 and S2 may be used for applying a signal to the interface 12 or sensing a signal from the interface 12. In either mode, the sense line couples the interface 12 to the data register 22. Sense line drivers/receivers (not shown) are coupled between the transistors 58, 60 and the data register 22 to enable such alternate direction signal communication. For a detailed description of the data register with amplifier/receivers see commonly-assigned U.S. Pat. Application No. 482,458 filed Feb. 20, 1990 for METHOD FOR OPERATING A LINEAR FEEDBACK SHIFT REGISTER AS A SHIFT REGISTER WITH A CROSSCHECK GRID STRUCTURE.

Alternate Embodiments

Figure 4:
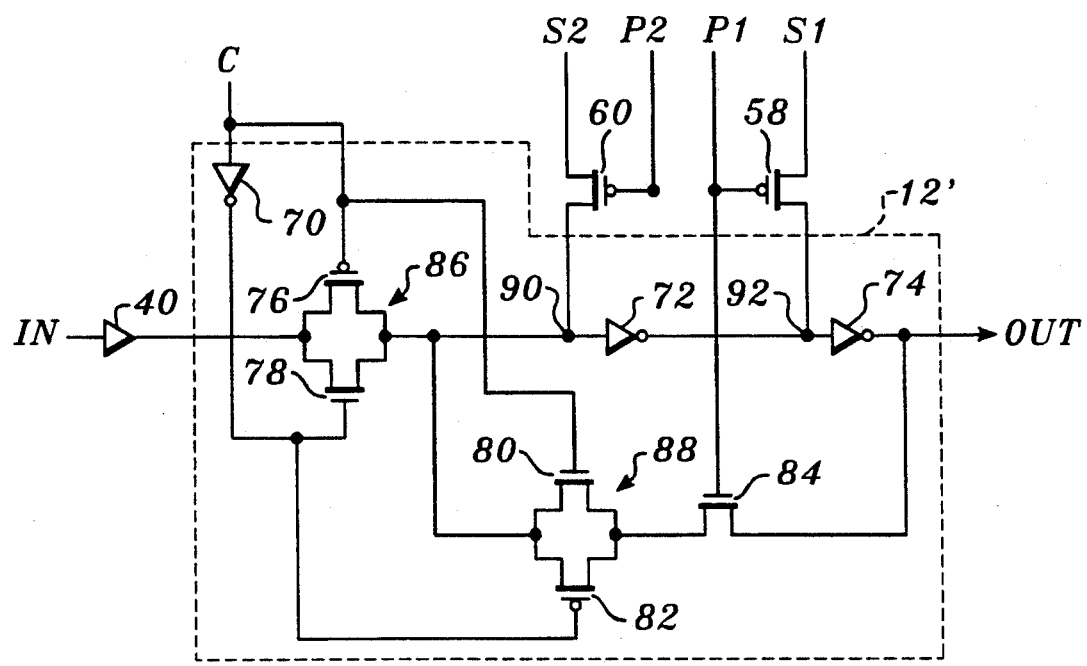
FIG. 4 is a schematic diagram of an alternate embodiment of a primary-input interface apparatus.

FIG. 4 shows an alternate embodiment of an interface 12' for coupling a primary input pin 14 to the operational circuitry 16. An input signal IN is received through input driver 40 to the interface 12'. The interface 12' includes invertors 70, 72, 74 and FET transistors 76, 78, 80, 82, 84. Transistors 58, 60 as previously described are part of the test matrix 18. Invertors 72, 74 form the latch which receives the test signal from the test matrix. Transistor 76, 78 form one transmission gate 86, while transistors 80, 82 form another transmission gate 88. The global control signal C is coupled directly to the gate of one transistor 76, 80 and indirectly via invertor 70 to the gate of the other transistor 78, 82.

Table B lists the functions performed by the interface 12':

TABLE B

| Instruction | Function |
| --- | --- |
| C = 0 | Normal Operations (IN = OUT) |
| C = 1 | Alternate signal op. (node 90 value = OUT) |
| P1 = 0, P2 = 0 | S2 written to node 90 |
| P1 = 0, P2 = 1 | Test matrix reads S1 |
| P1 = 1, P2 = 0 | Test matrix reads S2 |

TABLE B

When the control signal C is at first logic state (C=0, transmission gate 86 is active and transmission gate 88 is inactive causing the input signal IN to be transmitted through invertors 72, 74 for output as signal OUT. When the control signal is at a second logic state (C=1), transmission gate 86 is inactive and transmission gate 88 is active causing the output signal value OUT to be fed back through gate 88. When P1=0, P2=0 while C=1 the signal on line S2 is output through invertors 72, 74 as signal OUT. Thus, the value of S2 is fed back through the transmission gate 88 to node 90 for the alternate signal operation.

Self-test operations also are provided for sensing the value at nodes 90 or 92. When P1=0, P2=1 then the value at node 90 may be read into the data register 22. Similarly, when P1=1, P2=0 then the value at node 92 may be read into the data register 22.

Figure 5:
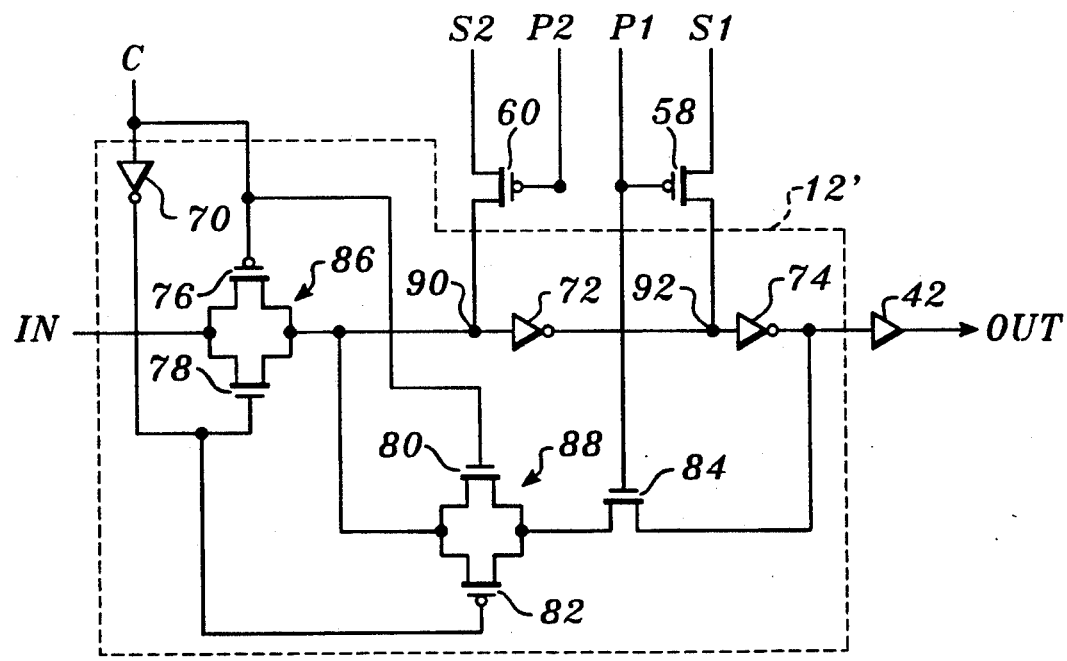
FIG. 5 is a schematic diagram of an alternate embodiment of a primary-output interface apparatus.

FIG. 5 shows an alternate embodiment of an interface 12' for coupling a primary output pin 14 to the operational circuitry 16. The interface 12' is the same as described above for FIG. 4. FIG. 5, however, shows that there is no input driver 40 and that there is an output driver 42 when applying the interface 12' to a primary output pin. Thus, a signal IN is received from the operational circuitry 16 and a signal is output through driver 42 as signal OUT for coupling to a primary output pin 14.

Table B above lists the functions performed by the interface 12'. Thus, when the control signal C is logic zero (C=0), transmission gate 86 is active and transmission gate 88 is inactive causing the input signal IN to be transmitted through invertors 72, 74 for output to driver 42. When the control signal is logic one (C=1), transmission gate 86 is inactive and transmission gate 88 is active causing the output of invertor 74 to be fed back through gate 88. When P1=0, P2=0 while C=1 the signal on line S2 is output through invertors 72, 74. Thus, the value of S2 is fed back through the transmission gate 88 to node 90.

Self-test operations also are provided for sensing the value at nodes 90 or 92. When P1=0, P2=1 then the value at node 90 may be read into the data register 22. Similarly, when P1=1, P2=0 then the value at node 92 may be read into the data register 22.

Concluding Remarks

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. An interface apparatus integral to an IC coupling an IC primary pin to IC operational circuitry, the IC having an internal test structure including a grid of probe lines and sense lines, a probe line and a sense line being coupled to the interface apparatus, the interface apparatus comprising:

a latch receiving a test signal from a sense line for latching said test signal, the latch coupled to a probe line which controls latching of the latch;
 a first transmission gate coupled to the primary pin and the operational circuitry receiving an input signal from one of the primary pin or operational circuitry and receiving a control signal, for passing the input signal when the control signal activates said first transmission gate, to:
   a) the operational circuitry when the input signal is received from the primary pin and
   b) to the primary pin when the input signal is received from the operational circuitry;
 a second transmission gate, receiving said control signal and coupled to said latch to receive said test signal and to said primary pin, for passing said test signal when the control signal activates said second transmission gate to:
   a) the operational circuitry when the test signal is received from the latch and
   b) to the primary pin when the test signal is received from the operational circuitry;
 wherein said control signal activates only one of said first and second transmission gates at a given time.

2. The apparatus of claim 1 in which said first transmission gate comprises a pair of FET transistors, one of said pair of transistors receiving the control signal at a gate, the other of said pair of transistors receiving an inversion of the control signal at a gate.

3. An integrated circuit having primary I/O pins, operational circuitry, a built in test structure, and interface apparatus, the test structure including a grid of probe lines and sense lines, a probe line and a sense line being coupled an interface apparatus, each interface apparatus coupling a primary I/O pin to the operational circuitry, an interface apparatus comprising:

a latch receiving a test signal from a sense line for latching said test signal, the latch coupled to a probe line which controls latching of the latch;
 a first transmission gate coupled to the primary pin and the operational circuitry receiving an input signal from one of the primary pin or operational circuitry and receiving a control signal, for passing the input signal when the control signal activates said first transmission gate, to:
   a) the operational circuitry when the input signal is received from the primary pin and
   b) to the primary pin w hen the input signal is received from the operational circuitry;
 a second transmission gate, receiving said control signal and coupled to said latch to receive said test signal and to said primary pin for passing said test signal when the control signal activates said second transmission gate to:
   a) the operational circuitry when the test signal is received from the latch and
   b) to the primary pin when the test signal is received from the operational circuitry;
 wherein said control signal activates only one of said first and second transmission gates at a given time; and
 wherein said control signal is a global control signal common to each interface apparatus which is generated from the test structure.

4. The integrated circuit of claim 3 in which each interface apparatus comprises 16 or fewer transistors.

5. An interface apparatus integral to an IC for coupling a first operational circuit element of the IC to a second operational circuit element of the IC, the IC having an internal test structure including a grid of probe lines and sense lines, a probe line and a sense line being coupled to the interface apparatus, the interface apparatus comprising:

a latch for latching a test signal received from one of said sense lines, the latch coupled to one of said probe liens wherein said probe line controls latching of the latch;
 a first transmission gate, coupled to receive an input signal from the first operational circuit element of the IC, coupled to receive a control signal, and coupled to said second operational circuit element of the IC for passing the input signal to said second operational circuit element of the IC when the control signal activates said first transmission gate;
 a second transmission gate, coupled to said second operational circuit element of the IC, coupled to said latch, and coupled to receive said control signal, for passing said test signal from said latch to said second operational circuit element of the IC when the control signal activates said second transmission gate; and
 wherein said control signal activates only one of said first and second transmission gates at a given time.

6. The apparatus of claim 5, wherein said control signal is a global control signal common to each interface apparatus which is generated from the internal test structure.

7. The apparatus of claim 5 in which said first transmission gate comprises a pair of FET transistors, one of said pair of transistors receiving the control signal at a gate, the other of said pair of transistors receiving an inversion of the control signal at a gate.

8. The integrated circuit of claim 5 in which each interface apparatus comprises 16 or fewer transistors.

* * * * *

UNITED STATES PATENT AND TRADEMARK OFFICE
CERTIFICATE OF CORRECTION

PATENT NO. : 5,202,624
DATED : April 13, 1993
INVENTOR(S) : Tushar R. Gheewala, et. al.

It is certified that error appears in the above-indentified patent and that said Letters Patent is hereby corrected as shown below:

Column 10, line 39, delete "liens" and insert therefor --lines--.

Signed and Sealed this

Fifth Day of April, 1994

Attest:

BRUCE LEHMAN

*Attesting Officer*     *Commissioner of Patents and Trademarks*